United States Patent [19]

Furrer et al.

[11] 4,159,202
[45] Jun. 26, 1979

[54] PHOTOPOLYMER HAVING 2-PYRIDONE SIDE GROUP

[75] Inventors: Harald Furrer, Frankfurt am Main; Hartmut Steppan, Wiesbaden-Detzheim; Gerhard Lohaus, Kelkheim, all of Fed. Rep. of Germany

[73] Assignee: Hoechst Aktiengesellschaft, Fed. Rep. of Germany

[21] Appl. No.: 800,824

[22] Filed: May 26, 1977

Related U.S. Application Data

[62] Division of Ser. No. 533,843, Dec. 18, 1974, abandoned.

[30] Foreign Application Priority Data

Dec. 20, 1973 [DE] Fed. Rep. of Germany ....... 2363513

[51] Int. Cl.$^2$ .......................... G03C 1/68; G03C 5/00
[52] U.S. Cl. .................................. 96/115 R; 96/27 R; 96/33; 96/35.1; 96/36; 96/36.2; 96/36.3; 526/258; 526/264; 526/265

[58] Field of Search ...................... 96/115 R, 33, 35.1; 260/88.3 L, 85.7, 88.1, 86.1, 80.3, 85.5, 78.5; 526/263, 264, 265, 258

[56] References Cited

U.S. PATENT DOCUMENTS

| 2,754,245 | 7/1956 | Hosmer | 260/88.3 L |
| 2,821,519 | 1/1958 | Glickman | 260/88.3 L |
| 3,136,755 | 6/1964 | Grosser et al. | 260/88.3 L |
| 3,666,765 | 5/1972 | Berijckere | 526/265 X |
| 3,697,266 | 10/1972 | Ono et al. | 260/88.3 L |
| 3,776,735 | 12/1973 | Bauer | 96/115 R |
| 3,901,710 | 8/1975 | Ranz et al. | 96/67 |
| 3,969,323 | 7/1976 | Furrer et al. | 526/265 X |

OTHER PUBLICATIONS

Mikhant'eu et al., Chem. Abs., 61 (1964) p. 3277c.
Fedorov et al., Chem. Abs., 64 (1966) p. 19938h.

Primary Examiner—Edward C. Kimlin
Attorney, Agent, or Firm—James E. Bryan

[57] ABSTRACT

This invention relates to a photo-cross-linkable polymer containing units each having a 2-pyridone side group. The invention also relates to a photosensitive copying material including the novel photo-cross-linkable polymer.

10 Claims, No Drawings

PHOTOPOLYMER HAVING 2-PYRIDONE SIDE GROUP

This is a division, of application Ser. No. 533,843, filed Dec. 18, 1974, now abandoned.

This invention relates to photo-cross-linkable polymers, and to the use of such polymers in photosensitive copying compositions and copying materials.

German Offenlegungsschrift No. 1,570,224, discloses the use, in copying compositions and copying materials, of photo-sensitive polymers which contain coumarin side groups. These polymers dissolve in only a limited number of organic solvents, so that only this limited number of solvents can be used to develop copying materials produced with these polymers. Furthermore, it would be desirable to be able to produce copying materials having a greater photosensitivity than that possessed by these known polymers.

German Offenlegungsschrift No. 2,310,307, proposes the use of photo-cross-linkable polymers having 2-pyrone side groups and these polymers do not have the above-mentioned disadvantages.

According to the present invention there is provided a photo-cross-linkable polymer containing units each having a substituted or unsubstituted 2-pyridone side group.

The pyridone groups may be linked to the main polymer chain either directly or by linking members. The pyridone groups additionally may be substituted by one or more alkyl groups having from 1 to 4 carbon atoms and or by one or more halogen atoms, preferably chlorine or bromine atoms. The preferred alkyl group is the methyl group; particularly preferred are pyridone groups which carry a methyl group in the 4-position of the pyridone ring.

In a preferred polymer of the invention, the units containing the 2-pyridone group have the general formula:

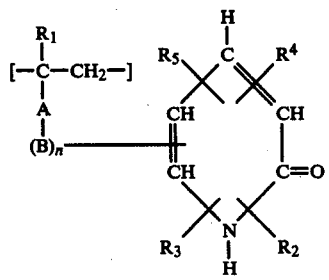

wherein:

$R_1$, $R_2$, $R_3$, $R_4$, and $R_5$, which may be the same or different, each represents hydrogen, halogen, preferably chlorine, or an alkyl group having from 1 to 4 carbon atoms, preferably a methyl group, A represents a direct covalent bond or one of the groups —CONH—, —COO—, —OCO—, —O—CHOH—,

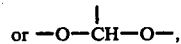

wherein each oxygen atom of the last-named group is linked to a unit of the basic chain, B represents an alkylene group having from 1 to 4, preferably 1 or 2, carbon atoms, and n is 0 or 1.

The link with the polymer chain may be at the 1-, 3-, 4-, 5- or 6-position of the pyridone ring. It preferably is at the 1-position, since many representatives of this type are particularly easy to produce.

Any straight-chain or branched, but not cross-linked, homopolymer or copolymer is suitable as the polymer chain, for example, polyethylenes or polymers produced from substituted ethylenes which, therefore, have a continuous carbon chain, and polyesters, polyamides or polyethers, or copolymers thereof.

The photo-cross-linkable polymers that are preferred, particularly because of the ease with which they can be produced, are those produced from monomeric 2-pyridones which contain a vinyl or vinylidene group, or those which contain units derived from such 2-pyridones. Monomeric 2-pyridones of this kind are, for example, acryl esters and preferably, methacryl esters of 2-pyridone alcohols, which can be readily produced by known methods; also preferred are acid amides such as can be produced, for example, from 2-pyridones having an amino group by reacting them with acrylic acid or, in particular, methacrylic acid. Polymers in which the pyridone group is to be attached directly to the main polymer chain may be produced from monomers which contain a vinyl group linked directly to the pyridone ring.

Further polymers of the invention are polymeric polyhydroxy compounds, all or some of the hydroxy groups of which are esterified with 2-pyridones carrying carboxylic groups, or are acetalized with 2-pyridones carrying aldehyde groups, as well as polymers which contain carboxylic acid groups some or all of which are esterified with 2-pyridones carrying a hydroxy group, or which have been converted into amides with 2-pyridones carrying an amino group.

Because of their good solubility, adherence and mechanical properties, preference is given to copolymers of the above-mentioned vinyl- or vinylidene-group containing 2-pyridones with ethylene or substituted ethylenes, and particularly with acrylic acid or methacrylic acid derivatives, especially with aromatically substituted ethylenes, for example, styrene, vinyl toluene, chlorostyrene or mixtures of two or more thereof. The molar ratio of 2-pyridone units to comonomer units depends upon the desired physical properties of the polymer and upon the required degree of cross-linking upon exposure to light.

Even additions of one mole % of a comonomer may have a marked effect, while on the other hand copolymers which contain only 5 mole % or less of 2-pyridone units are still capable of photo-cross-linking. Generally, however, the proportion of pyridone-containing monomer is between 90 and 10, and preferably is between 75 and 25 mole %.

The polymers of the invention may be produced, depending on their type, by (a) polymerizing by known techniques 2-pyridones which contain at least one polymerizable vinyl or vinylidene group, preferably with the aid of a free-radical initiator, and optionally together with a non-photosensitive or photosensitive copolymerizable vinyl or vinylidene compound, or (b) by esterifying or transesterifying, or acetalizing or transacetalizing polymers which carry free, esterified or acetalized hydroxy groups, with 2-pyridones carrying a carboxyl group or an aldehyde group, using known methods, or by esterifying or transesterifying polymers, which contain free or esterified carboxyl groups, carboxylic acid chloride groups or carboxylic acid anhydride groups, with 2-pyridones carrying a hydroxy group, or by reacting the latter polymers with 2-pyridones containing an amino group.

The polymerization mentioned under (a) above may be begun by the usual initiators, e.g. peroxides or azo compounds. It is preferably carried out in a solvent which is unaffected by the reaction conditions, e.g. in benzene, butanone, or dimethyl formamide. Particularly when working with small quantities of substances it is advantageous to exclude shortwave light as far as possible when carrying out the reactions, i.e. to work under yellow light, for example.

Examples of components which, when homopolymerized or copolymerized, lead to light-cross-linkable polymers in accordance with the invention are:

esters of polymerizable carboxylic acid with 2-pyridones carrying a hydroxy group, in particular:
1-(acryloyloxyethyl)-pyridone-(2),
1-(methacryloyloxyethyl)-pyridone-(2),
3-methyl-1-(methacryloyloxyethyl)-pyridone-(2),
6-methyl-1-(methacryloyloxyethyl)-pyridone-(2),
4,6-dimethyl-1-(acryloyloxyethyl)-pyridone-(2),
4,6-dimethyl-1-(2-methacryloyloxypropyl)-pyridone-(2),
3,4,6-trimethyl-5-(methacryloyloxymethyl)-pyridone-(2),
1,4,6-trimethyl-3-(methacryloyloxymethyl)-pyridone-(2),
1,4-dimethyl-6-(methacryloyloxymethyl)-pyridone-(2),
4-methyl-6-(methacryloyloxymethyl)-pyridone-(2),
1,4-dimethyl-3,5-dichlor-6-(methacryloyloxymethyl)-pyridone-(2), and
4,6-dimethyl-1-(α-chloroacryloyloxyethyl)-pyridone-(2), amides of polymerizable carboxylic acids with 2-pyridones carrying an amino group, e.g.:
4,6-dimethyl-1-(methacryloylamino)-pyridone-(2),
4,6-dimethyl-1-(acryloylamino)-pyridone-(2),
1,4,6-trimethyl-3-(methacryloylamino)-pyridone-(2),
1,4,6-trimethyl-3-(methacryloylaminomethyl)-pyridone-(2),
6-methyl-3-(acryloylamino)-pyridone-(2),
6-methyl-5-(acryloylamino)-pyridone-(2),
1,4-dimethyl-6-(methacryloylaminomethyl)pyridone-(2), and
1-butyl-4,6-dimethyl-5-(methacryloylamino)-pyridone-(2);

2-pyridones carrying vinyl groups, e.g.:
4,6-dimethyl-1-vinyl-pyridone-(2),
1,4-dimethyl-6-vinyl-pyridone-(2), and
1-vinyl-pyridone-(2).

The above-named compounds can be polymerized, to provide photo-cross-linkable polymers, alone, or mixed with each other or together with other substituted ethylenes, e.g. with methyl-, ethyl-, butyl-, n-hexyl- ethylhexyl-acrylate or -methacrylate, β-methoxyethyl-. β-methoxy-β-ethoxy-ethyl- or furfuryl-methacrylate, with derivatives of polymerizable carboxylic acids, for example those described in German Offenlegungsschrift No. 2,052,569, in particular acrylates or methacrylates of hydroxy group-containing trialkylphosphine oxides, the alkyl groups of which contain from 1–4 carbon atoms, e.g. dimethyl-(methacryloyloxymethyl)-phosphine oxide with acrylonitrile, acrylamide, maleic acid anhydride, vinyl acetate, vinyl pyridine, vinyl carbazole, or especially with vinyl aromatic substances such as styrene, α-methylstyrene, vinyl toluene or chlorostyrene.

Esters of polymerizable carboxylic acids with unsaturated alcohols, e.g. methallylacrylate and -methacrylate, allylmethacrylate, methylpentenyl - or propargyl methacrylate also may be used in limited amounts in the copolymerization, and beneficially influence the properties of the polymers.

It is also possible to carry out copolymerization with photo-active monomers of other types, in particular polymerizable 2-pyrone compounds as described in German Offenlegungsschrift No. 2,310,306, and products having special properties thus can be obtained.

A further method of producing the polymers of the invention, outlined under (b) above, comprises reacting polymers containing free carboxylic groups with 2-pyridones containing hydroxy or amino groups whereby there are obtained esters and amides, respectively. The esters and amides, of course, also can be produced by other known processes.

As polymers that contain free carboxylic groups there may be especially mentioned the homopolymers and copolymers of acrylic acid and methacrylic acid or their derivatives, and copolymers of maleic acid anhydride, e.g. with ethylene or styrene.

Photo-cross-linkable polymers of the invention also may be obtained, as outlined in (b) above, by esterifying polyhydroxy compounds of polymeric structure with 2-pyridones containing a carboxylic group. For this purpose the hydroxy groups do not need to be present in the free form; instead they may, for example, be esterified or acetalized, particularly with highly volatile acids or aldehydes, which are driven off during the reaction by the less volatile carboxylic acid. The carboxylic acids, of course, also can be used in the form of reactive derivatives such as chlorides, anhydrides or esters with highly volatile alcohols such as methanol. Polymeric polyhydroxy compounds which may be used are, in particular, polyvinyl alcohol or cellulose which may be partially esterified or etherified.

Other suitable polyhydroxy compounds are, for example, epoxide resins, e.g. condensation products of 2,2-bis-(p-hydroxy-phenyl)-propane with epichlorohydrin, condensation products of glycide and polyfunctional phenols, as well as polyamides, polyacetals, polyesters, polyurethanes, or polyureas, each containing hydroxy groups. Polymers of similar structure are also obtainable in a simple manner by the homopolymerization or copolymerization of the vinyl esters of carboxyl group-containing 2-pyridones.

Examples of 2-pyridones carrying carboxyl groups that can be used in the above-stated manner are:
1-carboxymethyl-pyridone-(2),
1-carboxyethyl-pyridone-(2),
4,6-dimethyl-1-carboxymethyl-pyridone-(2),
4,6-dimethyl-1-carboxypropyl-pyridone-(2),
4,6-dimethyl-1-carboxypentyl-pyridone-(2),
1,4,6-trimethyl-3-carboxy-pyridone-(2),
4,6-dimethyl-5-carboxy-pyridone-(2),
1,4-dimethyl-6-carboxy-pyridone-(2), and
1,3,4,6-tetramethyl-5-carboxymethyl-pyridone-(2).

A further method of producing photo-cross-linkable polymers of the invention, outlined under (b) above, comprises reacting polymeric polyhydroxy compounds with 2-pyridones carrying aldehyde groups. Suitable polyhydroxy compounds are, in particular, polyvinyl alcohol and cellulose. The hydroxy groups do not need to be present in free form for the purpose of the reaction; instead they may be completely or partially esterified or acetalized, particularly with highly volatile carboxylic acids or aldehydes. Examples of aldehydes which may be used for the purpose of acetalizing polyhydroxy compounds are:

1-(formylmethyl)-pyridone-(2),
4,6-dimethyl-1-formylmethyl-pyridone-(2),
3,4,6-trimethyl-1-formylmethyl-pyridone-(2),
1,4,6-trimethyl-3-formyl-pyridone-(2),
3,4,6-trimethyl-5-formyl-pyridone-(2), and
1,4-dimethyl-6-formyl-pyridone-(2).

As regards those of the above-named compounds not already known, these can be readily produced from known compounds by known methods. It is for example known from the literature that 2-pyrones can be converted into the corresponding 2-pyridones by reacting them with ammonia or primary amines, 2-pyridones which carry hydrogen on the nitrogen atom may be alkylated at this point, for example, by reaction with halogenated carboxylic acids or their esters to obtain the 1-carboxyalkyl-pyridones or their esters, or with alkenyl halides to form the 1-alkenyl-pyridones-(2) which can be oxidized to give the formylalkyl-pyridones-(2), by known methods, e.g. by means of ozone. The formyl group may be introduced into the pyridone ring by the Vilsmeyer reaction, and the oxidation or reduction of the aldehydes is a method of obtaining the corresponding carboxylic acid or hydroxymethyl derivatives.

Aminopyridones can be produced, for example, by nitrating the 2-pyridones with subsequent reduction.

Isomer mixtures, such as can occur for example upon substitution of the pyridone ring when the 3- and 5-positions are unoccupied are equally suitable as the prime isomers for use in preparing the polymers of the invention.

Depending upon their composition, the polymers of the invention are readily soluble in one or more of the common organic solvents, for example methanol, ethanol or acetone, which optionally may be in admixture with water, methylene chloride, chloroform, carbon tetrachloride, methyl glycol acetate, benzene, chlorobenzene, trichlorethylene, cyclohexanone, butanone or dimethyl formamide, or they may be separated from insoluble constituents by dissolution in one or more of these solvents. In the form of solutions in one or more of these solvents, they may be applied as thin layers to, for example, metallic or plastic carriers, and after removal of the solvent there remains a layer of polymer which adheres firmly to the carrier. When the layer is image-wise exposed through an original, using light sources which are normally employed in reproduction methods and which contain a considerable amount of light having a 300–700 nm wavelength, the exposed areas of the layer are cross-linked and are thus rendered insoluble, whereas the unexposed areas can be removed with the aid of a solvent so that a negative copy of the original is obtained.

Although the polymers of the invention have an inherently high photosensitivity, it is possible and on occasion advantageous to increase their sensitivity still further by the addition of sensitizers. Particularly suitable sensitizers, which are generally used in quantities of 0.1 to 15% by weight, preferably 1–10% by weight, based on the polymer, are carbonyl compounds such as acetophenone or 4,4'-bis-dimethylamino-benzophenone.

The following are some examples of the application of the polymers of the invention, which may be in the form of a layer thereof on any suitable carrier, as mentioned above, e.g. of metal (one or several metals), paper, plastic material, glass or ceramic material, or in the form of a self-supporting film, e.g. a film between two plastic protective films, or of a copying varnish, i.e. dissolved in a suitable solvent:

The production of printing plates for planographic printing and offset printing, screen printing, relief printing and intaglio printing, and in particular for use as photoresists for the photo-mechanical production of resists, in particular electro-resists or etching resists, e.g. for the manufacture of printed circuit boards, and for the etching of shaped parts, and the manufacture of graduated scales, face plates, etc.

The polymers, however, also may be used in a form suitable for producing individual copies, the copying layer being tinted and the unexposed areas being removed after image-wise exposure, or an uncolored layer being developed after image-wise exposure, the picture zones subsequently being tinted with a suitable colorant solution.

For the purpose of producing single copies it is also possible to make use of the differing melting or softening behavior of unexposed and exposed areas of the layer, e.g. by transferring unexposed and optionally tinted portions of the layer to receptor sheets, or by powdering the heated layer with pigments which preferentially adhere to the unexposed areas of the coating.

It is possible to combine the polymers of the invention with known copying compositions e.g. with compositions which contain or consist of diazo compounds, azido compounds or other photo-cross-linkable or photo-polymerizable systems.

It is possible—and herein resides a considerable advantage over earlier methods of producing photo-reactive polymers—to obtain polymers of the invention by hitherto tried and trusted polymerization processes. By a suitable choice of comonomers and by carrying out suitable tests relating to temperature, solvent, amount and nature of the catalyst, chain-breakers, etc. used in the process for production of the polymers, it is possible to obtain polymers having practically any required molecular weight within wide limits and thus additionally to influence the properties of the polymer, particularly its physical properties. In particular, however, the large number of comonomers which may be used offers practically unlimited possibilities of influencing the properties of the products in the desired manner. In particular, by the introduction, by polymerization, of unsaturated acids such as acrylic acid, methacrylic acid, crotonic acid, vinyl phosphonic acid or vinyl sulfonic acid, or for example, of dimethyl-methacryloyloxymethylphosphine oxide, it is also possible to modify at will the adherence, especially to metallic substrates, and the solubility of the polymers.

Thus for example, the copolymer of 30 mole %, 4,6-dimethyl-1-(2'-methacryloyloxy-ethyl)-pyridone-(2) (I) and 70 mole % dimethylmethacryloyloxymethyl-phosphine oxide exhibits excellent adhesion to an electrolytically roughened aluminum foil and it dissolves readily in water. In contrast to this, corresponding copolymers of I with, for example, vinyl toluene or butyl methacrylate are soluble only in purely organic solvents such as methylene chloride or chloroform.

Polymers which have a sufficient number of free acid or amino groups in the form of their salts with inorganic or organic bases or inorganic or organic acids are sufficiently soluble in water to enable processing to be carried out without the use of organic solvents. Copying coatings which contain polymers with free acid groups therefore can be developed with aqueous-alkaline solutions, and copying layers which contain polymers with amino groups can be developed with aqueous acidic solutions, small quantities of water-miscible organic solvents optionally being added.

The following Examples further illustrate the invention. Unless otherwise stated, the quantity ratios and percentages are in units of weight.

The production and testing of the photosensitive polymers were carried out in rooms illuminated with yellow light.

Polymerization was carried out generally in the manner set forth below:

A nitrogen-flushed solution of the monomers and a small quantity of a radical initiator, e.g. azido-isobutyric acid nitrile (AIBN), lauroyl peroxide or benzoyl peroxide, in a suitable solvent, e.g. butanone, was heated to a polymerization temperature, dependent upon the initiator and generally lying between 40° and 100° C., and preferably between 60° and 80° C., until the required degree of polymerization was reached, the mixture being stirred during heating.

When the polymerization was terminated, the reaction mixture was diluted with a suitable solvent, e.g. acetone, and was freed by filtration of any particles of gel present, by the application of pressure if necessary, and was stirred into a suitable precipitating agent, e.g. ether/petroleum ether (1/1) to induce the polymer to settle. After filtration, the polymer was dried at an elevated temperature, preferably between 40° and 60° C., in a vacuum, and was then ground.

The absorption maxima ($\lambda_{max}$ values) and the extinction values $E_{1\ cm}^{1\%}$ were measured in methylene chloride, except where otherwise stated. In the Examples, E stands for $E_{1\ cm}^{1\%}$, and connotes the optical density of a solution of 1 g of polymer in 100 ml of solution for a thickness of coating of 1 cm. RSV means the reduced viscosity $\eta red = (\eta\ spc./c)$ (dl/g) in a 1% solution at 25° C. Unless otherwise stated, the RSV values were determined in chloroform.

EXAMPLE 1

4,6-dimethyl-1-(2'-hydroxyethyl)-pyridone-(2) was converted with methacrylic acid chloride and by known methods into 4,6-dimethyl-1-(2'-methacryloyloxy-ethyl)-pyridone-(2) (I), melting point 61.5°–63.5° C.

7.05 g of I and 3.6 g of vinyl toluene (II) (molar ratio I:II - 1:1) were polymerized, with 18 mg of AIBN as an initiator, in 12 ml of butanone for 5½ hours at 80° C. in nitrogen. After cooling, the mixture was diluted with 100 ml of acetone, and the solution was filtered and stirred into 1 liter of petroleum ether (boiling point range 60°–80° C.). After drying, there were obtained 6.1 g of a white powder which was readily soluble in, for example, acetone, butanone, methylene chloride or chloroform.

$\lambda max = 310$ nm; $E = 159$
$RSV = 0.41$ dl/g.

The above-described polymer was applied to electrolytically roughened aluminum from a solution in dimethyl formamide together with 10% by weight of a sensitizer.

After drying for 5 minutes at 80° C., a uniform film, containing 4 g of polymer per m², was obtained.

The film was exposed for 2 minutes through a 21-stage gray wedge (density range 0.05–3.05, density increment 0.15) at a lamp distance of 5.7 cm in a strip-illumination apparatus which contained four Philips luminescent lamps, type TL/AK 40 W/05, disposed over an area of 20×60 cm; the film was then developed by immersion for 1 minute in butanone, was tinted with a 1% solution of fat-soluble black HB (C.I. 26150) in butanone to render the image easier to see, and the excess colorant was washed off with isopropanol.

| Sensitizer | Fully copied wedge stages |
|---|---|
| none | 6 |
| Michler's ketone | 13 |
| Acetophenone | 8 |

EXAMPLE 2

2.4 g of 4,6-dimethyl-1-(2'-methacryloyloxy-ethyl)-pyridone-(2) (I) and 15.3 g of n-hexylmethacrylate (III) (molar ratio I:III—1:9) were polymerized by means of 30 mg of AIBN in 20 ml of butanone for 5½ hours at 80° C. in nitrogen. After cooling, the material was diluted with 140 ml of acetone and 40 ml of methanol, and was pressure-filtered; the polymer was precipitated by stirring into 1500 ml of methanol. After drying, there were obtained 9.4 g of a white polymer which was readily soluble in xylene, acetone, butanone, methylene chloride or chloroform.

$\lambda max = 310$ nm; $E = 35.4$
$RSV = 0.44$ dl/g.

The polymer (4 g/m²) together with 10% by weight of Michler's ketone was deposited from chloroform onto electrolytically roughened aluminum. After 10 minutes' exposure as in Example 1, developing in acetone and tinting with fat-soluble black HB, 4–5 gray wedge stages could be detected.

EXAMPLE 3

7.05 g of 4,6-dimethyl-1-(2'-methacryloyloxy-ethyl)-pyridone-(2) (I) and 3.15 g of 4-vinyl pyridine (IV) (molar ratio I:IV=1:1) were polymerized by means of 18 mg of AIBN in 12 ml of butanone for 5½ hours at 80° C. in nitrogen. After having been diluted with 120 ml of chloroform and pressure-filtered, the material was stirred into 1 liter of ether/petroleum ether (1:1), and the precipitated slightly reddish polymer was dried. 6.8 g were obtained. The polymer was soluble in, for example, 2 N HCl, methanol, methylene chloride or chloroform.

$\lambda max = 310$ nm; $E = 154.5$
$RSV = 0.4$ dl/g.

A film of the polymer (4 g/m²) with 10% by weight of Michler's ketone was exposed for 2 minutes as in Example 1 on a foil of electrolytically roughened aluminum. After developing either with methanol or 2 N HCl, 9 gray wedge stages could be detected and these could be readily tinted with fat-soluble black HB from isopropanol/methylene chloride (4:1).

EXAMPLE 4

3.5 g of 4,6-dimethyl-1-(2'-methacryloyloxy-ethyl)-pyridone-(2) (I) and 6.7 g of dimethyl-methacryloyloxymethyl-phosphinic oxide (V) (molar ratio I:V=3:7) were polymerized by means of 15 mg of AIBN in 10 ml of butanone for 5½ hours at 80° C. in nitrogen. After dissolving with 120 ml methanol and pressure-filtration, the mixture was stirred into 1 liter of ether/petroleum ether (boiling point range 30°-80° C.; 1:1), and the precipitated polymer was dried. 10.1 g were obtained.

The polymer was readily soluble in water, methanol, ethylene glycol methyl ether acetate, dimethyl formamide, methylene chloride or chloroform.

$\lambda max = 301$ nm; $E = 70.2$
shoulder = 308 nm; $RSV = 0.97$ dl/g.

The film of the polymer (2 g/m$^2$) with 10% by weight of Michler's ketone on electrolytically roughened aluminum was exposed for 5 minutes in the manner described in Example 1, and was developed with water. After tinting with fat-soluble black HB, 11 gray wedge stages could be detected.

EXAMPLE 5

1-amino-4,6-dimethyl-pyridone-(2) (W. Ried et al, Chem. Ber. 90 (1957), 2841) was converted by known methods into 1-methacryloylamino-4,6-dimethyl-pyridone-(2) (VI), melting point 142°-143° C., by reacting it with methacrylic acid chloride.

7.8 g of VI and 6.3 g of n-hexyl methacrylate (III) (molar ratio VI:III = 1:1) were polymerized by means of 9 mg of AIBN in 65 ml of benzene for 7 hours at 80° C. in nitrogen. After the material had been diluted with 200 ml of chloroform and pressure-filtered, it was stirred into 1.5 liters of ether/petroleum ether (3:1), and the precipitated polymer was dried. 9.5 g of white flakes were obtained. The polymer was readily soluble in, for example, chloroform, methylene chloride or trichlorethylene.

$\lambda max = 303$ nm; $E = 196$
$RSV = 0.46$ dl/g.

A film of the polymer (2 g/m$^2$) with 10% by weight of Michler's ketone, on electrolytically roughened aluminum, was exposed for 30 seconds as in Example 1 through a metal original. After developing with trichlorethylene, drying in warm air, hydrophilizing with a 1% phosphoric acid solution, drying and tinting with fat-soluble black HB, a negative copy of the metal original was readily observable.

EXAMPLE 6

3-methacryloylamino-1,4,6-trimethyl-pyridone-(2) (VII), melting point 148°-151° C. was produced from 3-amino-1,4,6-trimethyl-pyridone-(2) by means of methacrylic acid chloride, using known methods.

2.2 g of VII and 1.2 g of vinyl toluene (II) (molar ratio VII:II = 1:1) were polymerized by means of 7 mg of AIBN in 7 ml of butanone for 6¼ hours at 80° C. in nitrogen. After dilution with 60 ml of chloroform and pressure-filtering, the polymer was caused to precipitate by being stirred into 1.6 liters of ether/petroleum ether (3:1). 1.6 g were obtained.

$\lambda max = 314$ nm; $E = 279$
$RSV = 0.22$ dl/g.

A film of the polymer (2 g/m$^2$) and 10% by weight of Michler's ketone was exposed for 2 minutes in the manner described in Example 1. After developing with methylene chloride and tinting with a 1% fat-soluble black HB solution in isopropanol/methylene chloride (4:1), 4 gray wedge stages could be detected.

EXAMPLE 7

1.1 g of 3-methacryloylamino-1,4,6-trimethyl-pyridone-(2) (VII) and 6.4 g of n-butylmethacrylate (VIII) (molar ratio VII:VIII = 1:9) were polymerized by means of 6 mg of AIBN in 5 ml of butanone for 6½ hours at 80° C. in nitrogen. After dilution with 60 ml of chloroform and pressure-filtration, the mixture was stirred into 1.5 liters of methanol. After the addition of a little NaCl, the polymer precipitated in lumps from the milky clouded liquid. 4.6 g were obtained.

The polymer was readily soluble in dioxane, methylene chloride, chloroform and xylene.

$\lambda max = 315$ nm; $E = 61.7$
$RSV = 0.89$ dl/g.

A strong ester band occurred at 1720 cm$^{-1}$ in the infra-red spectrum of the polymer in methylene chloride.

A film of the polymer (2 g/m$^2$) with 10% by weight of Michler's ketone was exposed, as in Example 1, for 5 minutes on a foil of electrolytically roughened aluminum, developed with dimethyl formamide and tinted with fat-soluble black HB from isopropanol/methylene chloride (4:1). Eight gray wedge stages could be seen.

EXAMPLE 8

5.1 g of 4,6-dimethyl-1-(2'-hydroxy-ethyl)-pyridone-(2) and 6.1 g of a 1:1 styrene:maleinic acid anhydride mixed polymer (RSV = 0.64 dl/g, 25° C., 1% in acetone) were stirred in 70 ml of absolute pyridine for 7 hours at reflux temperature.

After cooling to 25° C., the clear polymer solution was stirred into a mixture of 200 ml of glacial acetic acid and 800 ml of water, the polymer precipitating. After drying, 8.7 g of a light-brown polymer were obtained.

The polymer dissolved readily in dimethyl sulfoxide, dimethyl formamide or diacetone alcohol.

$\lambda max$ (DMF) = 312 nm; $E = 93.7$
$RSV = 0.76$ dl/g (25° C., 1% in DMF).

The polymer (2 g/m$^2$) together with 10% by weight of Michler's ketone was deposited from DMF on electrolytically roughened aluminum, and the film was dried for 5 minutes at 80° C. After 5 minutes' exposure as in Example 1, developing with DMF and tinting with a 10% aqueous methylene blue solution, 5 gray wedge stages became visible.

EXAMPLE 9

4,6-dimethyl-1-(2'-acetoxy-ethyl)-pyridone-(2) was obtained by known methods from 4,6-dimethyl-1-(2'-hydroxyethyl)-pyridone-(2), and its pyrolysis in a vertical tube (nitrogen stream) at 430° C. gave a 95% yield of 4,6-dimethyl-1-vinyl-pyridone-(2), melting point 44°-46° C.

$C_9H_{11}NO$-calculated: C 72.45%; H 7.43%; N 9.39%.
determined: C 72.6%; H 7.7%; N 9.2%.

3.72 g (25 m/mole) of 4,6-dimethyl-1-vinyl-pyridone-(2), 5.9 g (25 m/mole) of 1-(2'-methacryloyloxyethyl)-pyridone-(2) and 5.9 g (50 m/mole) of vinyl toluene were polymerized with 10 mg of AIBN as an initiator in 18 ml of butanone for 6 hours at 80° C. in the same way as in Example 1, and the resultant material was recovered. After drying, 12.9 g of a white powder were obtained, and this powder was readily soluble in, for example, butanone, methylene chloride or chloroform.

$\lambda max = 310$ nm; $E = 170$
$RSV = 0.92$ dl/g.

After exposure, a film of the polymer on the carrier as used in Example 1 was insoluble over the exposed areas.

It will be obvious to those skilled in the art that many modifications may be made within the scope of the present invention without departing from the spirit thereof, and the invention includes all such modifications.

What is claimed is:

1. A photosensitive copying material comprising a support and a photosensitive layer thereon comprising a photocrosslinkable polymer containing units each having a 2-pyridone side group and a photosensitizer.

2. A copying material as claimed in claim 1 wherein the polymer is a polyester of a polymeric polyhydroxy compound with a 2-pyridone compound containing a carboxyl group.

3. A copying material as claimed in claim 1 wherein the polymer is a polyacetal of a polymeric polyhydroxy compound with a 2-pyridone compound containing an aldehyde group.

4. A copying material as claimed in claim 1 comprising a polymer in which the units having the 2-pyridone side groups have the general formula:

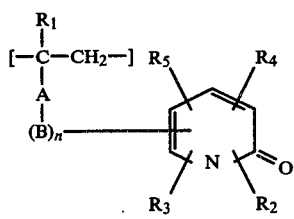

wherein $R_1$, $R_2$, $R_3$, $R_4$ and $R_5$ which may be the same or different, each represents hydrogen, halogen, or an alkyl group with from 1 to 4 carbon atoms, A represents a direct covalent bond or a

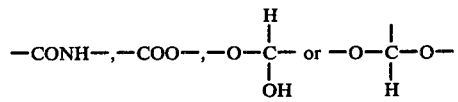

group wherein each oxygen atom of the last-named group is linked to a unit of the main chain, B represents an alkylene group having from 1 to 4 carbon atoms, and n is 0 or 1.

5. A copying material as claimed in claim 4 wherein said alkyl group is a methyl group.

6. A copying material as claimed in claim 4 wherein said halogen is chlorine.

7. A copying material as claimed in claim 4 wherein said alkylene group has 1 to 2 carbon atoms.

8. A copying material as claimed in claim 1 wherein the polymer comprises about 5 to 100 mole % of polymerized vinyl or vinylidene units, each of which is linked to the radical of a 2-pyridone compound through a direct covalent bond, an ester group, an amide group or an acetal group, and about 95 to 0 mole % of comonomer units selected from the group consisting of ethylene, vinyl esters, acrylic or methacrylic esters, -amides or -nitriles, maleic acid anhydride or vinyl heterocyclic or vinyl aromatic compounds which optionally contain a second polymerizable group.

9. A copying material as claimed in claim 8 wherein the polymer comprises about 10 to 90 mole % of said vinyl or vinylidene units and about 90 to 10 mole % of comonomer units.

10. A copying material as claimed in claim 8 which comprises a copolymer of an alkyl acrylate or alkyl methacrylate with an acrylate or methacrylate of a 2-pyridone compound containing a hydroxy group.

UNITED STATES PATENT OFFICE
CERTIFICATE OF CORRECTION

Patent No. 4,159,202          Dated  June 26, 1979

Inventor(s)  Harald Furrer and  Hartmut Steppan and Gerhard Lohaus

It is certified that error appears in the above-identified patent and that said Letters Patent are hereby corrected as shown below:

Column 10, line 24, "styrene:maleinic" should read - - - styrene:maleic - - -.

Column 11, the formula of Claim 4 should read as follows:

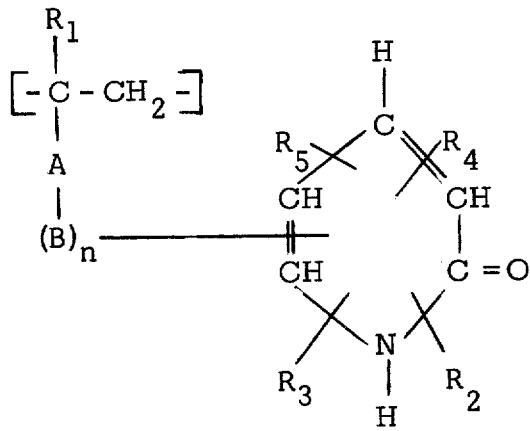

Column 1, in the general formula, "$R^4$" should read - - - $R_4$ - - -.

Signed and Sealed this

Twenty-third Day of October 1979

[SEAL]

Attest:

RUTH C. MASON
Attesting Officer

LUTRELLE F. PARKER
Acting Commissioner of Patents and Trademarks